United States Patent [19]

Sacripante et al.

[11] Patent Number: 5,989,629
[45] Date of Patent: Nov. 23, 1999

[54] BICHROMAL SPHERES

[75] Inventors: Guerino G. Sacripante, Oakville, Canada; James C. Mikkelsen, Jr., Los Altos, Calif.

[73] Assignee: Xerox Corporation, Stamford, Conn.

[21] Appl. No.: 09/035,590

[22] Filed: Mar. 5, 1998

[51] Int. Cl.⁶ .................................................. C23C 16/04
[52] U.S. Cl. .................... 427/180; 427/202; 427/214; 427/218; 427/222; 427/248.1; 427/25.31; 430/106
[58] Field of Search ..................................... 427/180, 202, 427/214, 218, 222, 248.1, 255.31; 430/106

[56] References Cited

U.S. PATENT DOCUMENTS

| | | | |
|---|---|---|---|
| 4,126,854 | 11/1978 | Sheridon | 340/373 |
| 4,143,103 | 3/1979 | Sheridon | 264/4 |
| 4,261,653 | 4/1981 | Goodrich | 350/362 |
| 4,438,160 | 3/1984 | Ishikawa et al. | 427/214 |
| 4,810,431 | 3/1989 | Leidner | 264/15 |
| 5,213,938 | 5/1993 | Sacripante et al. | 430/137 |
| 5,262,809 | 11/1993 | Nishimura et al. | 354/132 |
| 5,389,945 | 2/1995 | Sheridon | 345/85 |
| 5,534,379 | 7/1996 | Dalal et al. | 430/106 |
| 5,593,807 | 1/1997 | Sacripante et al. | 430/137 |

*Primary Examiner*—Timothy Meeks
*Attorney, Agent, or Firm*—E. D. Palazzo

[57] ABSTRACT

A process for the preparation of bichromal spheres comprising (I) preparing monochromal spheres by the aggregation and coalescence of an emulsion resin with a first colorant and inorganic salt; (ii) contacting the resulting monochromal spheres with an oxidizing agent, followed by a polymerization with a vinyl monomer and a free radical initiator; (iii) forming a of the resulting monochromal spheres on a substrate; and (iv) subjecting the resulting monochromal spheres to a vapor thermal deposition with a second colorant dissimilar than the first colorant to thereby coat one hemisphere of each of said monochromal spheres thereby resulting in bichromal spheres with dissimilar colors.

23 Claims, No Drawings

BICHROMAL SPHERES

BACKGROUND OF THE INVENTION

This invention generally relates to the preparation, or fabrication of small spheres, for example, from about 2 to about 50 microns in volume average diameter as measured by the Coulter Counter, with hemispheres of contrasting, or different colors and dissimilar zeta potentials and more specifically opposite surface charges, reference copending application U.S. Ser. No. 035,518, the disclosure of which is totally incorporated herein by reference, and filed concurrently herewith, and which spheres can be selected for use in electric paper display sheets. The present invention is generally directed to an electric paper display device, also known as a rotary, twisted ball or Gyricon display device, comprised of bichromal spheres or balls in which one hemispherical, that is about one half, or about 50 percent, of the surface of the ball is of one color, for example colored white and the other hemisphere is of a second dissimilar color, for example colored black as disclosed, for example, in U.S. Pat. No. 4,126,854, the disclosure of which is totally incorporated herein by reference, and wherein the bichromal spheres are suspended in a liquid cavity within an elastomer or polymer sheet, sandwiched between for example, a glass or plastic membrane. Under the action of an external electric field, the bichromal spheres rotate in accordance with their electrical anisotropy, or dipole, to provide an image. More specifically, the present invention is directed to a method for the preparation of bichromal spheres, and wherein each of the spheres are of small size, such as from about 2 to about 50 microns in diameter and preferably from about 5 to about 25 microns in diameter. The bichromal spheres can be fabricated by a process which comprises: (i) preparing monochromal spheres by the aggregation and coalescence of an emulsion resin with a first colorant, such as a pigment, usually a white pigment such as titanium dioxide or zinc oxide and to enable the desired particle size of for example, from about 2 to about 50 microns in diameter and more preferably of from about 5 to about 25 microns in diameter; (ii) subjecting the monchromal spheres formed to a seed polymerization process with for example a monomer, such as a vinyl monomer like styrene, alkyl acrylate, alkyl methacylate, fluoroalkylacrylates, or vinyl pyridine, and a free radical initiator to induce and direct a surface charge on the spheres; (iii) forming a monolayer of the monochromal spheres on a substrates, for example, by dip coating a substrate in an aqueous suspension of the monochromal spheres; (iv) followed by subjecting the monochromal spheres to a vapour deposition with a colorant such as black, cyan, red, or yellow resulting in the coating of the selected colorant into one hemisphere of the monochromal balls. The uncoated hemisphere remains as the second color.

PRIOR ART

Electric Paper or twisted ball panel display devices are known as indicated herein, and are described, for example, in U.S. Pat. Nos. 4,126,854; 4,143,103; 4,261,653; 4,438,160; 5,389,945, the disclosures of each of which are totally incorporated herein by reference. These devices are generally comprised of an elastomer, such as a cured polysiloxane, or a polymer sheet, such as polyvinylalcohol, sandwiched between two ITO coated electroded substrates, like glass or Mylar, and wherein the elastomer or polymer layer has closely packed cavities containing a bichromal sphere suspended in a dielectric liquid. The image is formed by the application of an electric field to rotate the bichromal sphere differentiated by the different static properties induced by a pigment and resulting in contrasting surface charge density of the two colored hemispheres. It is the difference in charge density between the hemispheres of the ball which produces an electric dipole, causing the ball to rotate until its dipole vector lines up with the direction of the electrical field established between opposed electrodes. In addition to the dipole charge distribution found on the bichromal ball in the presence of an electric field, there is also a monopole charge which is the net electrical charge of the entire ball. As a result of the monopole charge, the ball is caused to translate in the direction of the electrical field and will rest and be retained against the cavity wall. In order for the ball to rotate easily in the liquid within the cavity, due to the dipole charge, it is moved from contact with the cavity wall. When at rest against the cavity wall, friction and other forces will prevent it from rotating until it has been moved away again, due to the monopole charge. It is this feature which primarily enables long term, that is indefinite image retention in the display device.

Fabrication of bichromal spheres are known, for example, as in the aforementioned '103 patent (column 3, lines to 61) disclosed by Sheridon, and wherein the sphere is comprised of black polyethylene with a light reflective material, for example, titanium oxide, sputtered on hemisphere to provide the sphere with the desired light reflective and light absorptive hemisphere. In U.S. Pat. No. 4,438,160, the disclosures of which is totally incorporated herein by reference, a rotary ball is prepared by coating white glass balls of about 50 microns in diameter, with an inorganic coloring layer such as $MgF_2$ or $Sb_2S_3$ by evaporation. In a similar process, there is disclosed in an article entitled "The Gyricon—A twisting Ball Display", published in the proceedings of the S.I.D., Vol. 18/3 and 4 (1977), a method for fabricating bichromal balls by first heavily loading chromatic glass balls with a white pigment such as titanium oxides, followed by coating with a dense layer of nonconductive black material which coats only one hemisphere.

Also in U.S. Pat. No. 4,810,431, there is disclosed a process for generating spherical particles by (a) coextruding a fibre of a semi-circular layer of polyethylene pigmented white and a black layer of polyethylene containing magnetite, (b) chopping the resultant fiber into fine particles ranging from 10 microns to about 10 millimeters, (c) mixing the particles with clay or anti-agglomeration materials, and (d) heating the mixture with a liquid at about 120° C. to spherodize the particles, followed by cooling to allow for solidification.

There is also disclosed in U.S. Pat. No. 5,262,809, an apparatus for fabricating hemispherical bichromal balls, comprising a separator member having opposing first and second surfaces and an edge region in contact with both surfaces, and delivery means for flowing a first and second colored hardenable liquid material over the first and second surfaces, respectively, so that the liquid materials arrive at the edge at substantially the same flow rate and form a reservoir. The reservoir comprises side-by-side regions of different colors which do not intermix. Further means is provided for propelling the first and second liquid materials away from the separator member and out of the reservoir into a fluid medium as a plurality of side-by-side bichromal streams whose forward ends become unstable and breaks up into droplets which form into spherical balls, each of the balls comprising hemispheres of differently colored hardenable liquids. These bichromal balls are from about 5 to 200 microns in diameter.

Generally, the bichromal balls fabricated by the above methods have various forms of deficiency or disadvantages such as low optical density of the two hemispheres, poor control of bichromicity, low surface charge density and minimal means for independent control of surface charge density. Specifically, the surface charge density, or zeta potentials of the two contrasting hemispheres in the above prior art methods are solely induced, it is believed, by the intrinsic properties of the colorant or ball material. Moreover, many of the prior art methods are not easily economically scaleable to manufacturing conditions that enable high product yields, and particle size control of from about 5 to 25 microns, and also such spheres may not be readily obtainable with particles of a narrow size distribution, i.e., with polydispersities less than about 1.2 or preferably of from about 1.01 to about 1.15.

SUMMARY OF THE INVENTION

It is an feature of the present invention to provide a method for the preparation of bichromal spheres useful for Electric Paper, Gyricon or Twisting Ball Display devices. In these devices the electric paper functions as a source of an image which can be viewed, stored, copied, reproduced, or deleted.

In another feature of the present invention, there is provided a process for the fabrication of bichromal spheres with high optical density such as from about 1.2 to about 2.0, and contrasting surface charge by utilizing and supplementing colorants with polymeric charged materials, and a process for controlling the particle size with narrow particle size distribution by economical, and feasible manufacturing methods.

In yet another feature of the present invention there are provided processes for the preparation of a bichromal sphere of from about 2 to about 50 microns in volume average diameter and preferably of from about 5 to about 25 microns in volume average diameter.

Moreover, it is a feature of the present invention to provide processes for the preparation of a bichromal sphere with a narrow size distribution such as from about 1.05 to about 1.25.

In another feature of the present invention, there is provided processes for the fabrication of bichromal spheres by microsuspension processes or by the aggregation and coalescence of a polymer latex and colorant.

In yet another feature of the present invention there are provided a process for uniformly coating monochromal spheres on a substrate such as glass or plastic.

A further feature of the present invention is to provide bichromal spheres wherein the resulting two hemispheres are comprised of contrasting colors such as white and black respectively, each with high optical density, and wherein the surface charge of the two contrasting hemispheres are in opposite to each other thereby forming an optimum dipole, and wherein bichromal spheres are of small size such as from about 2 to about 50 microns in volume average diameter, and of narrow particle distribution such as from about 1.05 to about 1.20 in geometric size distribution.

In aspects of the present invention there is provided a process for the generation of bichromal spheres without the aforementioned prior art deficiencies, and wherein the two hemispheres of each ball are comprised of contrasting colors such as white and black respectively and wherein each of the spheres possess high optical density, such as from about 1.2 to about 2 and wherein the surface charge densities of the two contrasting hemispheres are independently controllable and which process comprises selectively polymerizing an appropriate material, or component (ionic or non-ionic), on one or both hemisphere. More specifically, the present invention relates to processes including a particle formation process resulting in the formation of spherical particles, of from about 5 to about 25 microns in diameter, as measured by the Coulter Counter with a geometric distribution of from about 1.05 to about 1.25 and preferably from about 1.1 to about 1.15 as measured by a Coulter Counter. The particle formation can be achieved by either microsuspension process or more preferably from an aggregation and coalescence process of a resin latex and a colorant, like pigment such as titanium oxide. The first spherical particle such as the white sphere is then subjected to a seed polymerization wherein the particle surface is grafted or coated, preferably with a vinyl resin thereby inducing a surface charge which is in contrast, that is opposite polarity, as the colorant, preferably black, which is subsequently on one hemisphere by vapour deposition method.

The present invention, in aspects thereof relate to:

a process for the preparation of bichromal spheres comprising (i) preparing monochromal spheres by the aggregation and coalescence of resin with a first colorant and an inorganic salt; (ii) contacting the resulting monchromal spheres with an oxidizing agent, followed by a polymerization with a monomer and a free radical initiator; (iii) forming the resulting monochromal spheres on a substrate; and (iv) subjecting the resulting monochromal spheres to a vapour thermal deposition with a second colorant dissimilar than the first colorant to thereby coat one hemisphere of each of and monochromal spheres thereby resulting in bichromal spheres with dissimilar colors;

a process, wherein the resin is an emulsion resin of a sodio sulfonated polyester resin, a styrene resin, a styrene-acrylate resin, a styrene-methacrylate resin, or a styrene-methacrylate-acrylic acid terpolymer, and the monomer is a vinyl monomer;

a process, wherein the first colorant is a pigment of titanium oxide;

a process, wherein the first colorant is a pigment of titanium oxide, zinc oxide, calcium carbonate, zinc stearate, magnesium oxide, or aluminum oxide present in an amount of from about 1 to about 30 weight percent of the bichromal sphere;

a process, wherein the oxidizing agent is cerium ammonium nitrate, chromic acid, potassium permanganate, chromium perchlorate, chromium nitrate, sodium dichromate, ammonium dichromate, potassium dichromate, metal nitrates, boronic acid, barium perchlorate, or calcium perchlorate, in an amount of from about 0.05 to about 1 weight percent of the bichromal sphere;

a process, wherein the oxidizing agent is cerium ammonium nitrate;

a process, wherein the bichromal sphere is from about 2 to about 50 microns in volume average diameter;

a process, wherein the bichromal sphere is from about 5 to about 25 microns in diameter;

a process, wherein the bichromal sphere is from about 2 to about 50 microns in diameter with a geometric distribution of from about 1.05 to about 1.4;

a process, wherein the monomer is a vinyl monomer of trifluorethylacrylate;

a process, wherein the monomer is a vinyl monomer of trifluorethyl acrylate, vinyl pyridine, vinyl chloride, styrene, methyl acrylate, ethylacrylate, propyl acrylate, butyl acrylate, lauryl acrylate, acrylic acid, methyl methacrylate, ethyl methacrylate, propyl methacrylate, butyl methacrylate, lauryl methacrylate, methacrylic acid, quaternary ammonium salts, amides, or sulfonates, and which monomer is optionally selected in an amount of from about 0.5 to about 5 weight percent of the bichromal sphere;

a process, wherein the free radical initiator is 2-2'-azobis (dimethyl-valeronitrile), peroxide initiators of benzoyl peroxide or lauryl peroxide, potassium persulfate, ammonium persulfate, a mixture of potassium persulfate and sodium bisulfite, each selected in an amount of from about 0.1 percent to about 10 percent by weight of the vinyl monomer;

a process, wherein the inorganic salt is magnesium chloride, calcium chloride, barium chloride, berylium chloride, copper sulfate, or zinc sulfate, each selected in an amount of from about 0.05 to about 1 weight percent of the bichromal sphere;

a process, wherein and aggregation and coalescence is accomplished by the addition of the inorganic salt;

a process, wherein the first colorant is present in an amount of about 3 to about 20 percent by weight of the sphere, and the second colorant is present in an amount of about 0.01 to about 5 weight percent of the sphere;

a process, wherein and polymerization is accomplished by heating at a temperature of about 25 to about 80 degrees Centigrade;

a process, wherein the resin is an emulsion comprised of water and resin, wherein the water is present in an amount of about 60 to about 90 weight percent, and the resin is present in an amount of about 10 to about 40 weight percent, or parts;

a process, wherein and vapor thermal deposition is accomplished at a temperature of about 100 degrees Centigrade to about 1,000 degrees Centigrade;

a process, wherein and deposition is for a period of about 10 minutes to about 6 hours;

a process, wherein and dissimilar colors are black and red;

a process, wherein and dissimilar colors are white and black;

a process, wherein and dissimilar colors are blue and white;

a process, wherein and dissimilar colors are red-and white; and a process for the preparation of bichromal spheres comprising the coalescence of resin with a first colorant; mixing with an oxidizing agent, and thereafter polymerizing in the presence of a monomer and an initiator; and adding a second colorant dissimilar than the first colorant.

The process of the present invention in embodiments comprises for example four steps. The first step comprises the economical preparation of monochromal spheres, preferably white in color, such as titanium oxide, of from 2 to about 50 microns in volume average diameter and preferably of from about 5 to about 25 microns in diameter with a narrow particle size distributions such as from about 1.05 to about 1.25 in geometric size distribution.

The second step is comprised of polymerizing a resin on the surface of the monochromal spheres formed primarily to induce surface charge necessary to obtain a contrasting surface charge.

The third step comprises the formation of a monolayer of monochromal sphere on a glass or plastic layer. Finally, the fourth step is comprised of subjecting the monochromal sphere to a vapour-deposition of a colored pigment or dye such as black, cyan, red, green, blue, brown, orange, or yellow onto one hemisphere and where there results bichromal spheres with different colors.

More specifically the second step involves polymerizing a resin, or polymer on the surface of the monochromal sphere primarily to induce surface charges necessary to obtain a contrasting zeta potential. This is achieved by a process as disclosed in U.S. Pat. No. 5,213,938, the disclosure of which is totally incorporated herein by reference. More specifically, in a preferred embodiment of the present invention white monochromal spheres prepared in the first step, are suspended in water and thereto is (i) added an oxidizing agent such as cerium ammonium nitrate or chromic acid, in an amount of from about 0.05 to about 0.1 percent by weight of the monochromal sphere, followed by stirring for an effective period, for example from about 1 to about 3 hours, and subsequent filtering the oxidized monochromal spheres and washing with for example, water. The resulting product is then re-suspended in water, from for example, about 10 to about 20 weight percent in water, and to this suspension is added a monomer, such as a vinyl monomer such as trifluoroethyl methacrylate or vinylpyridine, of from about 1 to about 5 weight percent of the spheres, and a free radical initiator such as potassium persulfate and sodium bisulfite. The mixture is then stirred for an additional about 3 to about 6 hours, at a temperature of from about room temperature, about 25 degrees Centigrade, to about 90 degrees Centigrade resulting in the polymerization of the vinyl monomer onto the surface of the white monochromal spheres.

The third step more specifically involves the separate uniform coating of a suitable substrate, such as glass or plastic substrate with for example, a monolayer, for example from about 10 to about 30 microns in thickness of the surface polymerized monochromal spheres, such as the white spheres, reference step 1. Although several methods may be employed to accomplish this, in a specific embodiment of the present invention, a preferred method involves the well known Langmiur Blodgett technique, for example, by dip coating a glass or plastic substrate into a suspension of the surface polymerized monochromal spheres in water, followed by drying such as heating at about 40 to about 60° C., in for example, a heated chamber, or by freeze drying.

The fourth step more specifically involves the coating of a colorant, like pigment or dye, preferably black or cyan, onto one hemisphere of the surface polymerized monochromal sphere. In a specific embodiment of the present invention the known Thermal Vapour Deposition methods can also be utilized in subliming a pigment or dye such as a black dye or cyan pigment, for example copper phthalocyanine, at a temperature of from about 100 to about 1,000 degrees and preferably from about 150 to about 800 degrees Centigrade under reduced pressure, such as from about 0.1 to about 10 mm-Hg, and wherein the colored coating on one hemisphere has a thickness of from about 0.01 microns to about 2 microns.

The formation of the monochromal spheres, can in embodiments be accomplished by microsuspension processes as practiced in electrophotographic toner processes such as disclosed in U.S. Pat. Nos. 5,194,356; 5,283,153; and 5,290,654, the disclosures of which are totally incorporated herein by reference. In a preferred embodiment, the monochromal spheres of the present invention can be prepared by an aggregation and coalescence process of a polymer latex and colorant, such as pigment as practiced in the electrophotographic toner processes, such as disclosed for example, in U.S. Pat. Nos. 5,278,020; 5,346,797 and 5,593,807, the disclosure of which are totally incorporated herein by reference. More specifically, the preparation of monochromal spheres can be accomplished by aggregating a polymer latex such as terpoly(styrene-n-butylacrylate-acrylic acid) or sodio sulfonated polyester resin as disclosed in U.S. Pat. No. 5,593,807, with a white pigment such as titanium oxide dispersion. Moreover, in a specific embodiment of the present invention, there is prepared a monochromal white sphere of from about 15 to about 20 microns in diameter and comprised of from about 75 to about 95 percent by weight of resin, such as sulfonated polyester and from about 5 to about 25 percent by weight of titanium oxide by:

(i) preparing an emulsion latex comprised of sodio sulfonated polyester resin particles of from about 5 to about 300 nanometers, and preferably 10 to about 250 nanometers in diameter and selected in an amount of from about 5 to about 40 weight percent, by heating the resin in water at a temperature of for example, from about 45° C. to about 80° C.;

(ii) adding a pigment dispersion containing from about 20 to about 50 percent of predispersed pigment, like titanium oxide pigment in water, with a mean pigment size ranging from about 50 to about 350 nanometers, to the latex mixture (i) followed by the addition of an inorganic complexing agent such as magnesium or calcium chloride of from about 1 to about 5 weight percent in water;

(iii) heating the resulting mixture at a temperature of from about 35° C. to about 60° C. and preferably from about 45 to about 55° C. thereby causing aggregation and coalescence resulting in monochromal spheres of from about 15 to about 20 microns in size with a geometric distribution from about 1.1 to 1.3, and optionally cooling the product mixture to about 25° C., and followed by filtering to remove the inorganic complexing agent and resuspending the product in water.

The preferred emulsion resin is a sodio sulfonated polyester, examples of which include those as illustrated in U.S. Pat. No. 5,593,807 the disclosure of which is totally incorporated herein by reference, such as a sodio sulfonated polyester, and more specifically a polyester, such as poly(1, 2-propylene-sodio 5-sulfoisophthalate), poly(neopentylene-sodio 5-sulfoisophthalate), poly(diethylene-sodio 5-sulfoisophthalate), copoly-(1,2-propylene-sodio 5-sulfoisophthalate)-copoly-(1,2-propylene-terephthalatephthalate), copoly-(1,2-propylene-diethylene-sodio 5-sulfoisophthalate)-copoly-(1,2-propylene-diethylene-terephthalate-phthalate), copoly-(ethylene-neopentylene-sodio 5-sulfoisophthalate)copoly-(ethylene-neopentylene-terephthalate-phthalate), or copoly-(propoxylated bisphenol A)-copoly-(propoxylated bisphenol A-sodio 5-sulfoisophthalate).

The inorganic complexing agent utilized for the aggregation and coalescence of the resin and colorant, like pigment particles is selected in an effective amount of, for example, from about 1 to about 5 percent by weight of the sphere, and this agent or component is selected for example, from the group comprised of halides, and sulfates, such as magnesium chloride, calcium chloride, barium chloride, beryllium chloride, copper sulfate, zinc sulfate, and the like.

Illustrative examples of oxidizing agents selected for the processes of the present invention include cerium ammonium nitrate, chromic acid, potassium permanganate, chromium perchlorate, chromium nitrate, sodium dichromate, ammonium dichromate, potassium dichromate, metal nitrates such as aluminum nitrate, boronic acid, barium perchlorate, calcium perchlorate, and the like, and which agents are utilized in various suitable amounts of for example, from about 0.05 to about 5 weight and preferably from about 1 to about 3 weight percent of the bichromal spheres.

Illustrative examples of vinyl monomers, include acrylates, methacrylates, styrene, fluorinated acrylates arid methacrylates, vinyl pyridine, vinyl chloride and the like, reference to for example U.S. Pat. No. 5,213,938, and which monomers are selected in an amount of for example, from about 0.5 to about 10 weight percent, and preferably from about 1 to about 5 weight percent of the bichromal spheres.

Illustrative examples of free radical initiators include azo-type initiators such as 2-2'-azobis(dimethyl-valeronitrile) and the like, peroxide initiators such as benzoyl peroxide, lauryl peroxide and the like, potassium persulfate, ammonium persulfate, a mixture of potassium persulfate and sodium bisulfite, and the like, with the effective quantity of initiator being, for example, from about 0.1 percent to about 10 percent, and preferably from about 1 to about 5 weight percent of the vinyl monomer.

Various known colorants, pigments, or whitening agents present in the monochromal spheres, prepared for example by the first step, in an effective amount of, for example, from about 5 to about 25 percent by weight of the sphere, and preferably in an amount of from about 10 to about 20 weight percent, that can be selected include oxides, and carbonates such as titanium oxide, aluminum oxide, barium oxide, calcium carbonate, calcium oxide, magnesium oxide, zinc oxide, mixtures thereof and the like.

Various known colorants, dyes or pigments can be utilized in for example the vapour thermal deposition of the spheres, and in an effective amount of, for example, from about 0.1 to about 25 percent by weight of the sphere, and preferably in an amount of from about 0.1 to about 5 weight percent, examples of which are, cyan, magenta, yellow, red, green, brown, blue or mixtures thereof. Specific examples of colorants include phthalocyanine HELIOGEN BLUE L6900™, D6840™, D7080™, D7020™, PYLAM OIL BLUE™, PYLAM OIL YELLOW™, PIGMENT BLUE 1™ available from Paul Uhlich & Company, Inc., PIGMENT VIOLET 1™, PIGMENT RED 48™, LEMON CHROME YELLOW DCC 1026™, E.D. TOLUIDINE RED™ and BON RED C™ available from Dominion Color Corporation, Ltd., Toronto, Ontario, NOVAPERM YELLOW FGL™, HOSTAPERM PINK E™ from Hoechst, and CINQUASIA MAGENTA™ available from E.I. DuPont de Nemours & Company, and the like.

Generally, colorants that can be selected are cyan, magenta, or yellow pigments, and mixtures thereof. Examples of magentas include, for example, 2,9-dimethyl-substituted quinacridone arid anthraquinone dye identified in the Color Index as CI 60710, CI Dispersed Red 15, diazo dye identified in the Color Index as CI 26050, CI Solvent Red 19, and the like. Illustrative examples of cyans include copper tetra(octadecyl sulfonamido)phthalocyanine, x-copper phthalocyanine pigment listed in the Color Index as CI 74160, CI Pigment Blue, and Anthrathrene Blue, identified in the Color Index as CI 69810, Special Blue X-2137, and the like; while illustrative examples of yellows that may be selected are diarylide yellow 3,3-dichlorobenzidene acetoacetanilides, a monoazo pigment identified in the Color Index as CI 12700, CI Solvent Yellow 16, a nitrophenyl amine sulfonamide identified in the Color Index as Foron Yellow SE/GLN, CI Dispersed Yellow 33

2,5-dimethoxy-4-sulfonanilide phenylazo-4'-chloro-2,5-dimethoxy acetoacetanilide, and Permanent Yellow FGL include dyes, pigments, mixtures thereof, mixtures of pigments, mixtures of dyes, and the like.

The first sphere can be of various suitable colors, such as white, red, green, blue, yellow, brown, black and other known colors, and the second sphere is of a dissimilar known color, for example the first sphere can be colored white and the second a different color like black, and wherein the display sheet substrates are for example components of a polymer, a metal exoide, and the like.

The following nonlimiting Examples are provided.

EXAMPLE I

Preparation of 17 micron bichromal spheres wherein one hemisphere is a white surface coated with poly(trifluorethylmethacrylate), and the other hemisphere is blue, and wherein the resin is a polyester resin, the white pigment or whitening agent is titanium dioxide and the cyan pigment is a copper phthalocyanine.

Step 1

Preparation of White Monochromal Spheres 50 grams of the sulfonated polyester resin, copoly(propylene-diethylene-terephthalate)copoly(propylene-diethylene-5-sulfo-isopthalate), reference Example I of U.S. Pat. No. 5,593,807, the disclosure of which is totally incorporated herein by reference was hydrodislpersed in 250 grams of water at 60° C. The resulting polyester emulsion was then cooled to room temperature, about 25 degrees Centigrade throughout, and to this was added 10 grams of a titanium oxide dispersion in water (50% solids) available from Sun Chemicals. The resulting mixture was then homogenized at about 1000 rpm with the slow addition of a weight percent magnesium chloride aqueous solution (50 mL), and the resulting mixture was then transferred to a 1 liter kettle. The mixture resulting was then stirred at 200 rpm and heated to 55° C. overnight, about 18 hours, to yield 50 grams of monochromal white spheres of 17.6 microns in volume average diameter measured using the Coulter Counter and with a geometric sized distribution of 1.13.

Step 2

Surface Polymerizationization of the White Monochromal Spheres

To 10 grams of the white spheres (prepared above in Step 1) in 100 ml of water was added 0.25 grams of cerium ammonium nitrate, and 1 ml of a 1N solution of nitric acid. The resulting mixture was stirred for 3 hours followed by filtration of the white spheres, and resuspension of the spheres in 100 ml of water. To this was then added 0.25 grams of potassium persulfate, 0.25 grams of sodium bisulfite and 0.5 grams of triflouroethyl acrylate. The resulting mixture was then stirred for three hours at room temperature (about 25° C.), and the resulting surface grafted monochromal spheres were then filtered, washed with water and re-suspended in about 1 liter of water.

Step 3

Coating of Spheres on Glass and Thermal Vapour Deposition Using Copper Phthlocyanine Pigment The monochromal charged white spheres resulting were then uniformly coated as a monolayer of a thickness of less than about 500 nanometers, such as about 400 nanometers, on glass slide substrate by Langmiur Blodget technique, and left air drying, about 18 hours. The spheres were then subjected to vacuum, such as from about 0.0001 to about 0.1 mm-Hg, and then sublimed with copper phthalocyanine pigment to result in bichromal white/cyan spheres, with nearly equal portions of blue and white color. The 0.3-micron-thick phthalocyanine layer has little affect on the ball diameter, which remains at about 17 microns diameter. In this Example, the fluoroacrylated white side of the ball is believed to negatively charged and the copper-phthalocyanine blue coated side of the ball is believed to charge positive.

Step 4

Fabrication of a Display Sheet

A display sheet was fabricated from the above bichromal sphere by (1) mixing 50 grams of the prepared bichromal spheres with 50 grams of SYIGARD® 185 silicone elastomer Kit available from Dow Corning; (2) forming a sheet by spreading the mixture on a glass plate surface and which spreading was with a metering bar such as an 8-Path Wet Film Applicator (available from P. Gardner Company) with a gap of from about 20 microns to about 500 microns, and crosslinking the SYLGARD elastomer sheet by heating to a temperature of from about 80° C. to about 100° C. for a duration of from about 3 to about 24 hours; (3) plasticizing the sheet by immersing it in a vessel containing a suitable oil such as isopar or silicone oil, in an amount of from about 50 to about 500 milliliters to form an oil-filled cavity within the sheet; and (4) removing the sheet from the oil vessel and sealing it between addressing plates of MYLAR with a thickness of about 5 to about 15 microns, or indium tin oxide glass with a similar thickness.

EXAMPLE II

Preparation of 17 micron bichromal spheres wherein one hemisphere is white surface coated with poly(trifluorethylmethacrylate), and the other hemisphere is red, and wherein the resin is a polyester resin, the white pigment is titanium dioxide and the red pigment is bis(2-propyl) perylene.

The white monochromal spheres prepared by the procedure of Example I, steps 1 and 2, were utilized in the following Step 3.

Step 3

Coating of Spheres on Glass and Thermal Vapour Deposition Using Copper Phthlocyanine Pigment The monochromal charged white spheres were then uniformly coated as a monolayer, on a glass slide substrate by Langmiur Blodget technique, and left air drying overnight. The spheres were then subjected to vacuum, such as from about 0.0001 to about 0.1 mm-Hg, and then sublimed with bis-(2-propyl)perylene pigment to result in bichromal white/red spheres, with nearly equal portions of blue and white. The 0.3 micron-thick dye layer has little affect on the ball diameter, which remains at about 17 microns in diameter.

EXAMPLE III

Preparation of 17 micron bichromal spheres wherein one hemisphere is white surface coated with poly(vinyl pyridine), and the other hemisphere is blue, and wherein the resin is a polyester resin, the white pigment is titanium dioxide and the cyan pigment is copper phthalocyanine.

Step 1

The White Monochromal Spheres of Example I were Utilized for this Example

Step 2

Surface Polymerizationization of the White Monochromal Spheres

To 10 grams of the white spheres (prepared above in Step 1) in 100 ml of water was added 0.25 grams of cerium ammonium nitrate, and 1 ml of a 1N solution of nitric acid. The mixture was stirred for 3 hours followed by filtration of the white spheres, and resuspension of the spheres in 100 ml of water. To this was then added 0.25 grams of potassium persulfate, 0.25 grams of sodium bisulfite and 0.5 grams of vinyl pyridine. The mixture was then stirred for three hours, and the resulting surface grafted monochromal spheres were then filtered, washed with water and re-suspended in about 1 liter of water.

Step 3
Coating of Spheres on Glass and Thermal Vapour Deposition Using Copper Phthlocyanine Pigment The monochromal charged white spheres were then uniformly coated as a monolayer on a glass slide substrate by Langmiur Blodget technique, and left air drying overnight, about 18 hours throughout. The spheres were then subjected to vacuum, such as from about 0.0001 to about 0.1 mm-Hg, and then sublimed with copper phthalocyanine pigment to result in bichromal white/cyan spheres, with nearly equal portions of blue and white.

Other modifications of the present invention may occur to one of ordinary skill in the art subsequent to a review of the present application, and these modifications, including equivalents, or substantial equivalents thereof, are intended to be included within the scope of the present invention.

What is claimed is:

1. A process for the preparation of bichromal spheres comprising (i) preparing monochromal spheres by the aggregation and coalescence of resin with a first colorant and an inorganic salt; (ii) contacting the resulting monochromal spheres with an oxidizing agent, followed by a polymerization of a monomer and a free radical initiator onto the monochromal spheres, (iii) forming the resulting monochromal spheres on a substrate; and (iv) subjecting the resulting monochromal spheres to a vapor thermal deposition with a second colorant dissimilar than the first colorant to thereby coat one hemisphere of each of said monochromal spheres thereby resulting in bichromal spheres with dissimilar colors.

2. A process in accordance with claim 1, wherein the resin is an emulsion resin of a sodio sulfonated polyester resin, a styrene resin, a styrene-acrylate resin, a styrene-methacrylate resin, or a styrene-methacrylate-acrylic acid terpolymer, and the monomer is a vinyl monomer.

3. A process in accordance with claim 1, wherein the first colorant is a pigment of titanium oxide.

4. A process in accordance with claim 1, wherein the first colorant is a pigment of titanium oxide, zinc oxide, calcium carbonate, zinc stearate, magnesium oxide, or aluminum oxide present in an amount of from about 1 to about 30 weight percent of the bichromal spheres.

5. A process in accordance with c aim 1, wherein the oxidizing agent is cerium ammonium nitrate, chromic acid, potassium permanganate, chromium perchlorate, chromium nitrate, sodium dichromate, ammonium dichromate, potassium dichromate, metal nitrates, boronic acid, barium perchlorate, or calcium perchlorate, in an amount of from about 0.05 to about 1 weight percent of the bichromal spheres.

6. A process in accordance with claim 1, wherein the oxidizing agent is cerium ammonium nitrate.

7. A process in accordance with claim 1, wherein the bichromal spheres are from about 2 to about 50 microns in diameter.

8. A process in accordance with claim 1, wherein the bichromal spheres are from about 5 to about 25 microns in diameter.

9. A process in accordance with claim 1, wherein the bichromal spheres are from about 2 to about 50 microns in diameter with a geometric distribution of from about 1.05 to about 1.4.

10. A process in accordance with claim 1, wherein the monomer is a vinyl monomer of trifluoroethyl acrylate.

11. A process in accordance with claim 1, wherein the monomer is a vinyl monomer of trifluoroethyl acrylate, vinyl pyridine, vinyl chloride, styrene, methyl acrylate, ethylacrylate, propyl acrylate, butyl acrylate, lauryl acrylate, acrylic acid, methyl methacrylate, ethyl methacrylate, propyl methacrylate, butyl methacrylate, lauryl methacrylate, or methacrylic acid, and which monomer is selected in an amount of from about 0.5 to about 5 weight percent of the bichromal spheres.

12. A process in accordance with claim 1, wherein the free radical initiator is 2-2'-azobis(dimethyl-valeronitrile), peroxide initiators of benzoyl peroxide or lauryl peroxide, potassium persulfate, ammonium persulfate, a mixture of potassium persulfate and sodium bisulfite, in an amount of from about 0.1 percent to about 10 percent by weight of the vinyl monomer.

13. A process in accordance with claim 1, wherein the inorganic salt is selected from the group consisting of magnesium chloride, calcium chloride, barium chloride, beryllium chloride, copper sulfate, and zinc sulfate, and wherein each salt when present is selected in an amount of from about 0.05 to about 1 weight percent of the bichromal spheres.

14. A process in accordance with claim 1, wherein said aggregation and coalescence is accomplished by the addition of said inorganic salt.

15. A process in accordance with claim 1, wherein the first colorant is present in an amount of about 3 to about 20 percent by weight of the spheres, and the second colorant is present in an amount of about 0.01 to about 5 weight percent of the spheres.

16. A process in accordance with claim 1, wherein said polymerization is accomplished by heating at a temperature of about 25 to about 80 degrees Centigrade.

17. A process in accordance with claim 1, wherein said resin is an emulsion comprised of water and resin, wherein the water is present in an amount of about 60 to about 90 weight percent, and the resin is present in an amount of about 10 to about 40 weight percent.

18. A process in accordance with claim 1, wherein said vapor thermal deposition is accomplished at a temperature of about 100 degrees Centigrade to about 1,000 degrees Centigrade.

19. A process in accordance with claim 18, wherein said deposition is for a period of about 10 minutes to about 6 hours.

20. A process in accordance with claim 1, wherein said dissimilar colors are black and red.

21. A process in accordance with claim 1, wherein said dissimilar colors are white and black.

22. A process in accordance with claim 1, wherein said dissimilar colors are blue and white.

23. A process in accordance with claim 1, wherein said dissimilar colors are red and white.

* * * * *